(12) United States Patent
Ritchie et al.

(10) Patent No.: US 9,812,303 B2
(45) Date of Patent: Nov. 7, 2017

(54) CONFIGURABLE VARIABLE POSITION CLOSED TRACK MAGNETRON

(71) Applicant: APPLIED MATERIALS, INC., Santa Clara, CA (US)

(72) Inventors: Alan Ritchie, Menlo Park, CA (US); Ryan Hanson, Cupertino, CA (US); Xianwei Zhao, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 593 days.

(21) Appl. No.: 14/182,740

(22) Filed: Feb. 18, 2014

(65) Prior Publication Data
US 2014/0246314 A1    Sep. 4, 2014

Related U.S. Application Data

(60) Provisional application No. 61/771,450, filed on Mar. 1, 2013.

(51) Int. Cl.
*C23C 14/34* (2006.01)
*H01J 37/34* (2006.01)

(52) U.S. Cl.
CPC ...... *H01J 37/3455* (2013.01); *H01J 37/3405* (2013.01); *H01J 37/3452* (2013.01); *H01J 37/3461* (2013.01)

(58) Field of Classification Search
CPC . H01J 37/3452; H01J 37/3455; H01J 37/3461
See application file for complete search history.

(56) References Cited

U.S. PATENT DOCUMENTS

| 5,188,717 A | 2/1993 | Broadbent et al. |
| 5,284,564 A * | 2/1994 | Maass ............... C23C 14/35 204/192.12 |
| 6,207,026 B1 * | 3/2001 | Crocker ............ C23C 14/35 118/724 |
| 6,440,282 B1 * | 8/2002 | Wada ............. H01J 37/3408 204/298.17 |
| 2002/0162737 A1 * | 11/2002 | Durs ............... C23C 14/548 204/192.12 |

(Continued)

OTHER PUBLICATIONS

International Search Report and Written Opinion mailed May 23, 2014 for PCT Application No. PCT/US2014/018022.

(Continued)

*Primary Examiner* — Jason M Berman
(74) *Attorney, Agent, or Firm* — Moser Taboada; Alan Taboada (57) ABSTRACT

Methods and apparatus for a magnetron assembly are provided herein. In some embodiments, a magnetron assembly includes a first base plate; a second base plate movable with respect to the first base plate between a first position and a second position; an outer magnetic pole in the shape of a loop and comprising an outer magnetic pole section coupled to the first base plate and an outer magnetic pole section coupled to the second base plate; and an inner magnetic pole disposed within the outer magnetic pole, wherein the outer and inner magnetic poles define a closed loop magnetic field, and wherein the closed loop magnetic field is maintained when the second base plate is disposed in both the first position and a second position.

20 Claims, 4 Drawing Sheets

(56) References Cited

U.S. PATENT DOCUMENTS

| | | |
|---|---|---|
| 2003/0070922 A1 | 4/2003 | Ishii et al. |
| 2006/0144703 A1 | 7/2006 | Yang et al. |
| 2007/0108041 A1 | 5/2007 | Guo |
| 2008/0099329 A1 | 5/2008 | Pavloff et al. |
| 2008/0149473 A1 | 6/2008 | Ajima |
| 2009/0026073 A1* | 1/2009 | Harada .................. C23C 14/35 |
| | | 204/298.16 |
| 2010/0012481 A1 | 1/2010 | Guo et al. |
| 2010/0126848 A1 | 5/2010 | Ohmi et al. |

OTHER PUBLICATIONS

Search Report from The State Intellectual Property Office of the People's Republic of China dated Jan. 11, 2017 received for China Patent Application No. 2014800058049.

\* cited by examiner

CONFIGURABLE VARIABLE POSITION CLOSED TRACK MAGNETRON

CROSS-REFERENCE TO RELATED APPLICATIONS

This application claims benefit of U.S. provisional patent application Ser. No. 61/771,450, filed Mar. 1, 2013, which is herein incorporated by reference.

FIELD

Embodiments of the present invention generally relate to magnetrons for use in physical vapor deposition chambers for substrate processing.

BACKGROUND

Sputtering, alternatively called physical vapor deposition (PVD), has long been used in depositing metals and related materials in the fabrication of semiconductor integrated circuits. Its use has been extended to depositing metal layers onto the sidewalls of high aspect-ratio holes such as vias or other vertical interconnect structures. Currently, advanced sputtering applications include depositing a metallic seed layer for later electroplating of the metallic layer in the via and depositing a barrier layer on the dielectric material of the via sidewall to prevent the metallic layer from diffusing into the dielectric.

For example, titanium nitride (TiN) metallization has been used for a number of years in back end of the line (BEOL) and front end of the line (FEOL) semiconductor applications. One exemplary application is for a hard mask which is a BEOL application with multiple layers or passes per device on the substrate. The requirement is to deposit a blanket TiN layer that will act as both a patterning layer and a hard mask. TiN is a metal layer having a number of desirable qualities. However one significant down side is the inherent stress and tendency of TiN layers to crack, peel, and flake, thus generating defects.

Thus, the inventors have provided a magnet configuration that can advantageously be used to deposit materials while improving particle performance.

SUMMARY

Methods and apparatus for a magnetron assembly are provided herein. In some embodiments, a magnetron assembly includes a first base plate; a second base plate movable with respect to the first base plate between a first position and a second position; an outer magnetic pole in the shape of a loop and comprising an outer magnetic pole section coupled to the first base plate and an outer magnetic pole section coupled to the second base plate; and an inner magnetic pole disposed within the outer magnetic pole, wherein the outer and inner magnetic poles define a closed loop magnetic field, and wherein the closed loop magnetic field is maintained when the second base plate is disposed in both the first position and a second position.

In some embodiments, a magnetron assembly includes a support member having a central axis about which the magnetron assembly rotates; a first base plate fixedly coupled to the support member; a second base plate movably coupled to the support member between a first position and a second position; an outer magnetic pole in the shape of a loop and comprising an outer magnetic pole section coupled to the first base plate and an outer magnetic pole section coupled to the second base plate; and an inner magnetic pole disposed within the outer magnetic pole, wherein the outer and inner magnetic poles define a closed loop magnetic field, and wherein the closed loop magnetic field is maintained when the second base plate is disposed in both the first position and a second position, wherein the closed loop magnetic field has a first geometric configuration when the second base plate is disposed in the first position and a second geometric configuration, different than the first geometric configuration, when the second base plate is disposed in the second position.

In some embodiments, a substrate processing system includes a chamber; a lid removably disposed atop the chamber; a target assembly coupled to the lid, the target assembly including a target material to be sputtered from the target and deposited on a substrate; a substrate support disposed within the chamber for supporting a substrate during processing; and a magnetron assembly. The magnetron assembly can be as described in any of the embodiments disclosed herein.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

The present invention relates to a dual position magnetron that can advantageously provide reduced particles during deposition processes and physical vapor deposition (PVD) chambers incorporating such magnetrons.

Embodiments of the magnetron disclosed herein have magnet assemblies that are configurable in two positions, thus enabling a change in the magnetic field at the sputtering target surface by the reconfiguration of the magnet poles in the different positions. The magnetron has two modes that are both essentially large closed track configurations. Each mode is selected by rotating a section of the magnet. Rather than rotating the whole assembly or a small section of an arc, a section of a first closed track magnet may be rotated to form a second closed track magnet having a different magnetic field than the first closed track magnet.

In most embodiments, the dominant field lines of a magnetron will be close to the radial edge of the sputter target. In some embodiments, to maximize target utilization and keep the cathode (target) voltage as low as possible, a length of the closed track is configured to be a long as possible. As such, in some embodiments, it is not possible to rotate the whole magnet around a pivot, for example, when the outer radius track is longer than half the circumference of magnetron housing. Accordingly, embodiments of the present invention advantageously allows very large closed track magnetrons to be configured into a different closed track magnetron, thereby providing two different magnetic fields.

Figure 1:
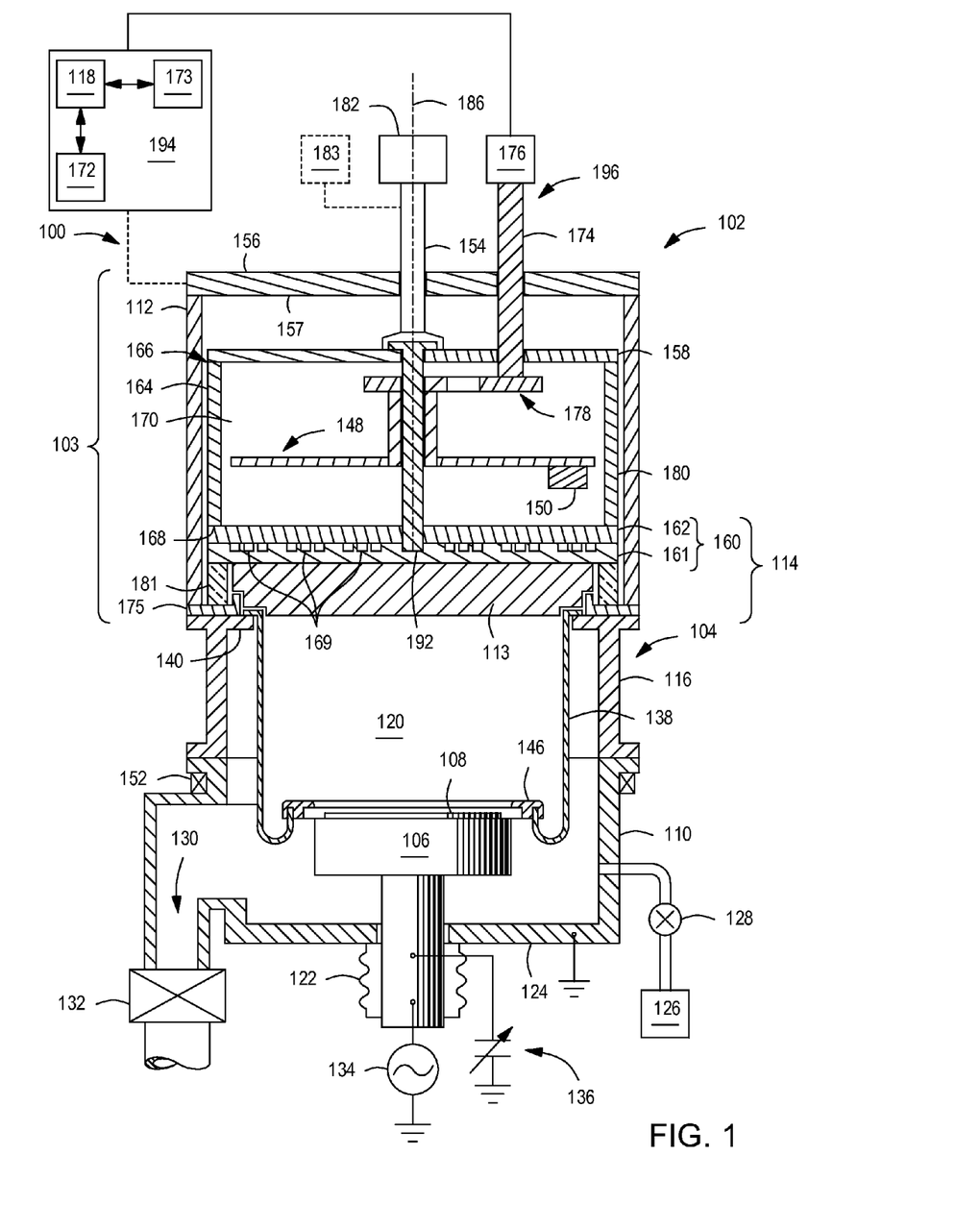
FIG. 1 depicts a schematic cross sectional view of a process chamber in accordance with some embodiments of the present invention.

FIG. 1 depicts a simplified, cross-sectional view of a physical vapor deposition (PVD) processing system 100 in accordance with some embodiments of the present invention. Examples of other PVD chambers suitable for modification in accordance with the teachings provided herein include the ALPS® Plus and SIP ENCORE® PVD processing chambers, both commercially available from Applied Materials, Inc., of Santa Clara, Calif. Other processing chambers from Applied Materials, Inc. or other manufactures, including those configured for other types of processing besides PVD, may also benefit from modifications in accordance with the teachings disclosed herein.

For illustration, the PVD processing system 100 includes a chamber lid 102 removably disposed atop a process chamber 104. The chamber lid 102 may include a target assembly 114 and a grounding assembly 103. The process chamber 104 contains a substrate support 106 for receiving a substrate 108 thereon. The substrate support 106 may be located within a lower grounded enclosure wall 110, which may be a chamber wall of the process chamber 104. The lower grounded enclosure wall 110 may be electrically coupled to the grounding assembly 103 of the chamber lid 102 such that an RF return path is provided to an RF power source 182 disposed above the chamber lid 102. The RF power source 182 may provide RF energy to the target assembly 114 as discussed below. Alternatively or in combination a DC power source may be similarly coupled to target assembly 114

The PVD processing system 100 may include a source distribution plate 158 opposing a backside of the target assembly 114 and electrically coupled to the target assembly 114 along a peripheral edge of the target assembly 114. The PVD processing system 100 may include a cavity 170 disposed between the backside of the target assembly 114 and the source distribution plate 158. The cavity 170 may at least partially house a magnetron assembly 196 as discussed below. The cavity 170 is at least partially defined by the inner surface of a conductive support ring 164, a target facing surface of the source distribution plate 158, and a source distribution plate facing surface (e.g., backside) of the target assembly 114 (or backing plate assembly 160).

The PVD processing system 100 further includes a magnetron assembly 196. The magnetron assembly 196 provides a rotating magnetic field proximate the target to assist in plasma processing within the process chamber 104. The magnetron assembly includes a rotatable magnet assembly 148 disposed within the cavity 170. The rotatable magnet assembly 148 rotates about a central axis 186 of the process chamber 104. The rotatable magnet assembly 148 provides two different closed magnetic field configurations that are selectable during use. In some embodiments, the configuration can be selected by rotating a section of the rotatable magnet assembly 148, as described below with respect to FIGS. 2A-B and 3A-B.

Figure 2A:
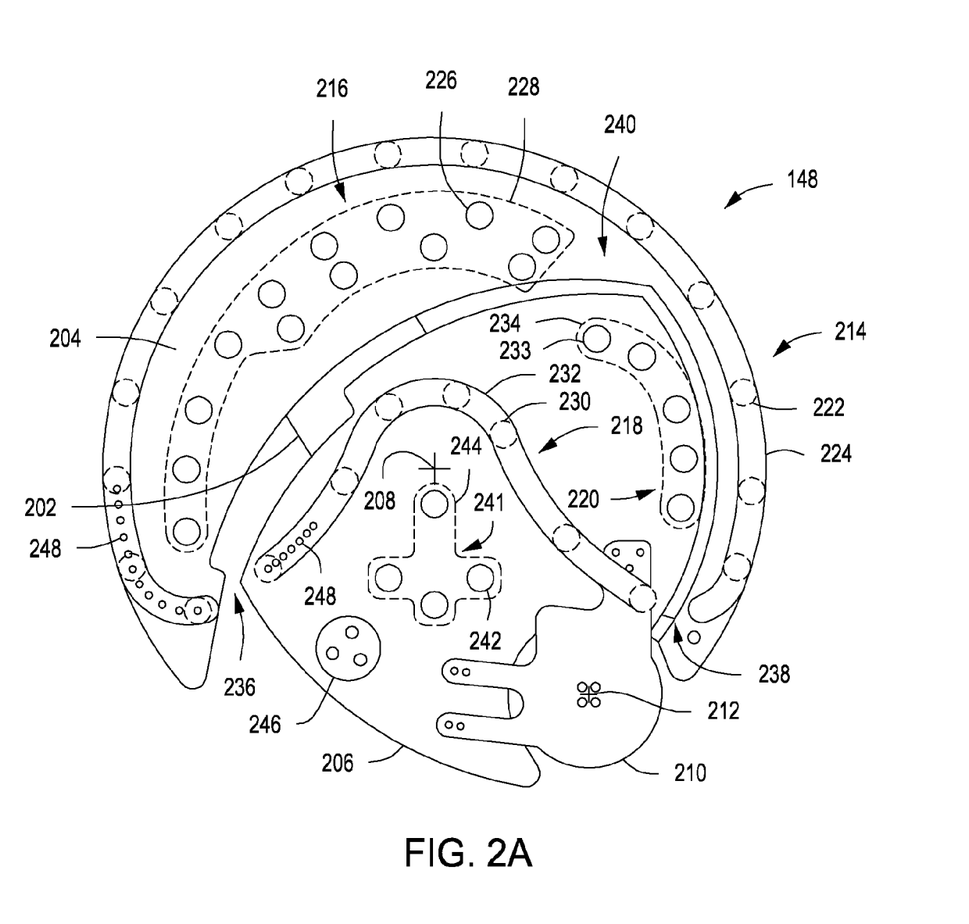
FIGS. 2A-B respectively depict bottom views of a rotatable magnet assembly in accordance with some embodiments of the present invention.
Figure 2B:
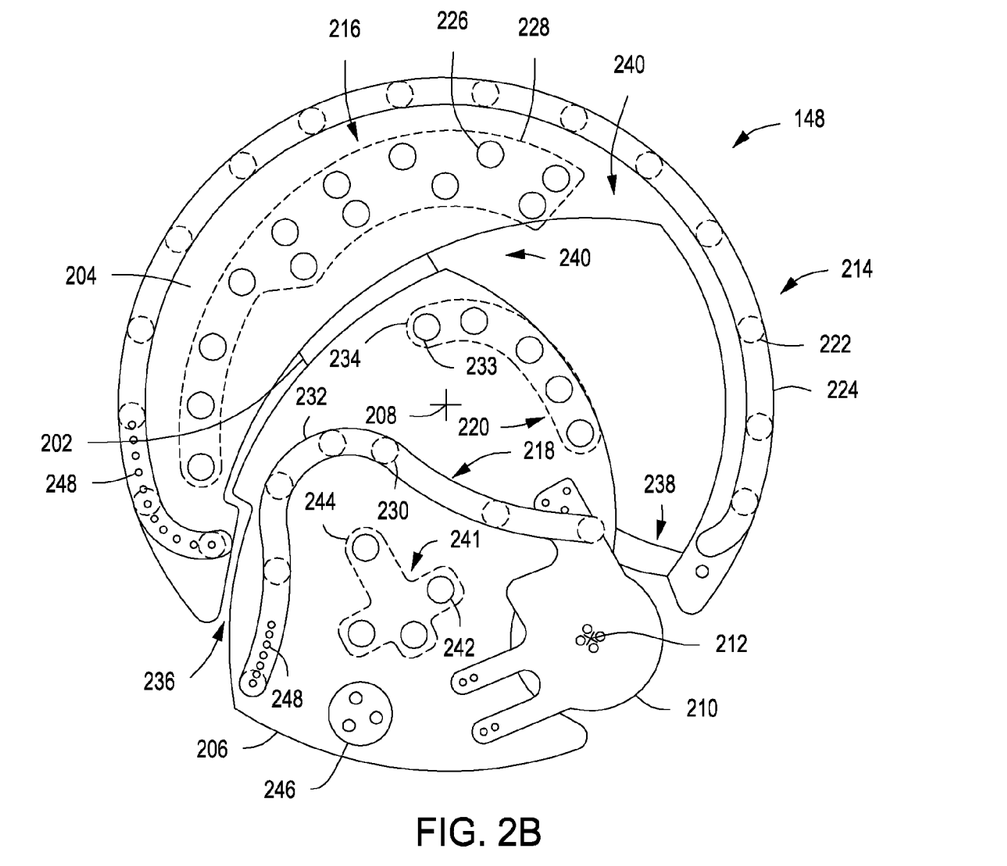

For example, FIGS. 2A-B respectively depict bottom views of the rotatable magnet assembly 148 in accordance with some embodiments of the present invention. In embodiments consistent with FIGS. 2A-B, the rotatable magnet assembly 148 includes a support member 202 coupled to a first base plate 204 and a second base plate 206. The support member 202 has a central axis 208, about which the rotatable magnet assembly 148 rotates. The first base plate 204 and second base plate 206 are movable with respect to each other. For example, in some embodiments, the first base plate 204 may be fixedly coupled to the support member 202 and the second base plate 206 may be movably coupled to the support member 202.

For example, in some embodiments, a rotatable bracket 210 may be provided to movably couple the support member 202 and the second base plate 206. The rotatable bracket 210 may have an axis of rotation 212 that facilitates rotating the second base plate 206 from a first position (as depicted in FIG. 2A) to a second position (as depicted in FIG. 2B). Mechanical stops, for example, within the rotatable bracket 210 or on one or more of the first base plate 204, the second base plate 206, or the support member 202 limit the range of motion of the second base plate 206 with respect to the first base plate 204. The relative position of the first base plate 204 with respect to the second base plate 206 may be controlled by any suitable means, such as an actuator, the speed of rotation of the rotatable magnet assembly 148, or the direction of rotation of the rotatable magnet assembly 148.

Figure 3A:
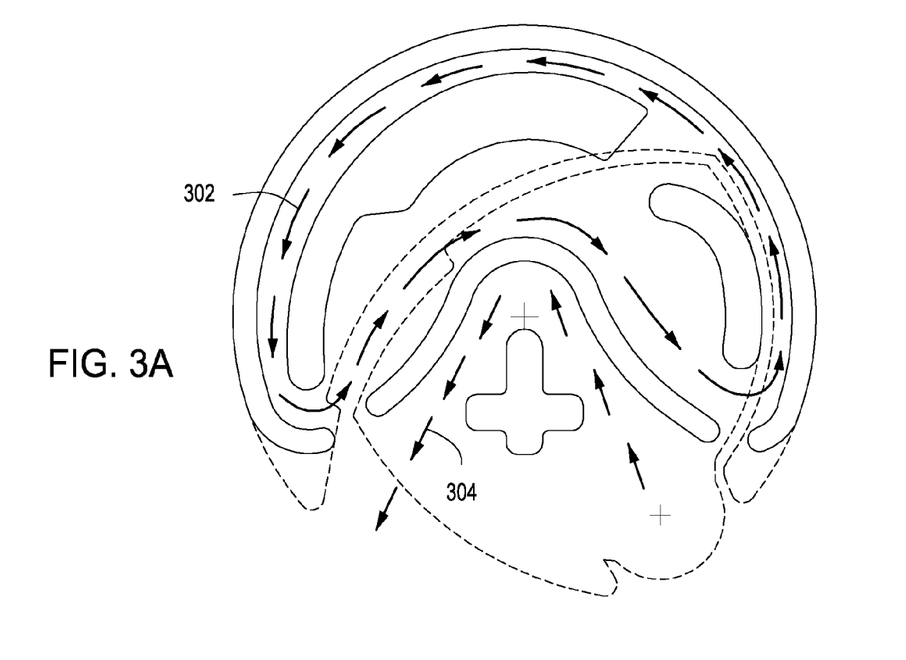
FIGS. 3A-B depict schematic bottom views of a magnetic field track of a rotatable magnet assembly in accordance with some embodiments of the present invention.

The rotatable magnet assembly 148 provides a dual position closed loop magnetic field that extends across the first base plate 204 and the second base plate 206. As used herein, a closed loop magnetic field refers to a magnetic field having no discrete beginning and end, but instead forms a loop. The closed loop magnetic field generally includes an outer magnetic pole and an inner magnetic pole that together form the closed loop magnetic field. For example, in the embodiment depicted in FIG. 2A, the first base plate 204 includes an outer magnetic pole section 214 and an inner magnetic pole section 216 (shown in dashed lines). The second base plate 206 includes an outer magnetic pole section 218 and an inner magnetic pole section 220 (shown in dashed lines). The outer magnetic pole sections 214, 218 together form the outer magnetic pole. The inner magnetic pole sections 216, 220 together form the inner magnetic pole and are disposed within the closed loop of the outer magnetic pole. As depicted in FIG. 3A, such a configuration provides a first closed loop magnetic field 302 having a first geometric configuration.

The support member 202 and the first and second base plates 204, 206 may be constructed from any material suitable to provide adequate mechanical strength to rigidly support the inner and outer magnetic poles, such as a non-magnetic metal, for example, non-magnetic stainless steel. The first and second base plates 204, 206 may have any shape suitable to support the magnetic poles in a desired position as well as to be able to rotate within the cavity 170. The support member 202 may have any suitable shape, such as a disk, rectangular, or other shape suitable to adequately support the first and second base plates 204, 206.

Each of the magnetic pole sections may be formed by a plurality of magnets arranged to form the desired shape of the magnetic pole section. In some embodiments, each of the first and second base plates 204, 206 may have a plurality of holes (not shown) to facilitate coupling individual magnets of the plurality of magnets to the first and second base plates 204, 206 in desired locations. The plurality of holes also facilitates ease of reconfiguration of the positions and/or numbers of magnets in any magnetic pole or magnetic pole section. In some embodiments, a pole plate may be coupled to the tops of the plurality of magnets to provide a more uniform magnetic field. In some embodiments, each pole plate may also have a plurality of holes 248 to facilitate coupling respective pole plates to respective pluralities of magnets. For ease of viewing only some of the plurality of holes 248 are shown in FIGS. 2A-B. However, holes may be provided on any of the pole plates as well as along the entire pole plate.

For example, the outer magnetic pole section 214 of the first base plate 204 includes a plurality of magnets 222 (shown in dashed lines) and a pole plate 224 disposed atop the plurality of magnets 222. Similarly inner magnetic pole section 216 (shown in dashed lines) includes a plurality of magnets 226 and a pole plate 228 (shown in dashed lines). On the second base plate 206, outer magnetic pole section 218 includes a plurality of magnets 230 (shown in dashed lines) and a pole plate 232. Inner magnetic pole section 220 (shown in dashed lines) includes a plurality of magnets 233 (shown in dashed lines) and a pole plate 234.

The number and configuration of the magnets may be selected as desired to form a magnetic field of a desired shape and strength. Generally, each of the magnets in a respective inner or outer magnetic pole section has the same polarity (e.g., polar orientation, such as north up or south up). Each of the outer magnetic pole sections have the same polarity and each of the inner magnetic pole sections have the same polarity. The inner and outer magnetic poles have opposite polarity. Thus, the polarity within each magnetic pole is the same (e.g., north or south), but the polarity between poles are opposite (e.g., inner north and outer south or inner south and outer north).

Thus, in some embodiments, each of the magnets in a respective inner or outer magnetic pole section has the same polarity. However, in some embodiments, a small number of magnets within a given magnetic pole section may have a reversed orientation or polarity as compared to the remaining magnets in the magnetic pole. Overall, the magnetic pole section with the flipped magnets retains the same net polarity, but the magnetic strength is weakened at the locations of the flipped magnets. In some embodiments, less than half of the magnets have their polarity reversed. In some embodiments, much less than half of the magnets have their polarity reversed, such as between about 25% (e.g., 1 out of 4 magnets) to about 15% (e.g., 2 out of 13 magnets). The number and location of the magnets having a reverse polarity within a given magnetic pole section may be selected to advantageously control an erosion profile of the target, and therefore, to control substrate film properties such as deposition thickness uniformity and sheet resistance (Rs) uniformity. For example, the magnets having reversed polarity may be located in positions to control target erosion near the center of the target or at specified target radii, as desired to control target lifetime and/or film properties on the substrate.

Generally, the pole plates 224, 228, 232, 234 may be fabricated from a ferromagnetic material, such as in a non-limiting example, 400-series stainless steel or other suitable materials. The magnetic strength of the each of the inner and outer magnetic fields may be the same or different.

The inventors have discovered that even though the inner and outer magnetic pole sections may span across the first base plate and the second base plate, which are movable with respect to each other, a substantially continuous magnetic field may be provided as if the inner and outer magnetic poles were provided on a single plate. For example, the outer magnetic pole sections 214, 218 are separated by gaps 236 and 238, and inner magnetic pole sections 216, 220 are separated by a gap 240. However, the observed magnetic field provided is substantially similar to the magnetic field that would be provided if the outer magnetic pole sections and the inner magnetic pole sections were each respectively single pieces.

Figure 3B:
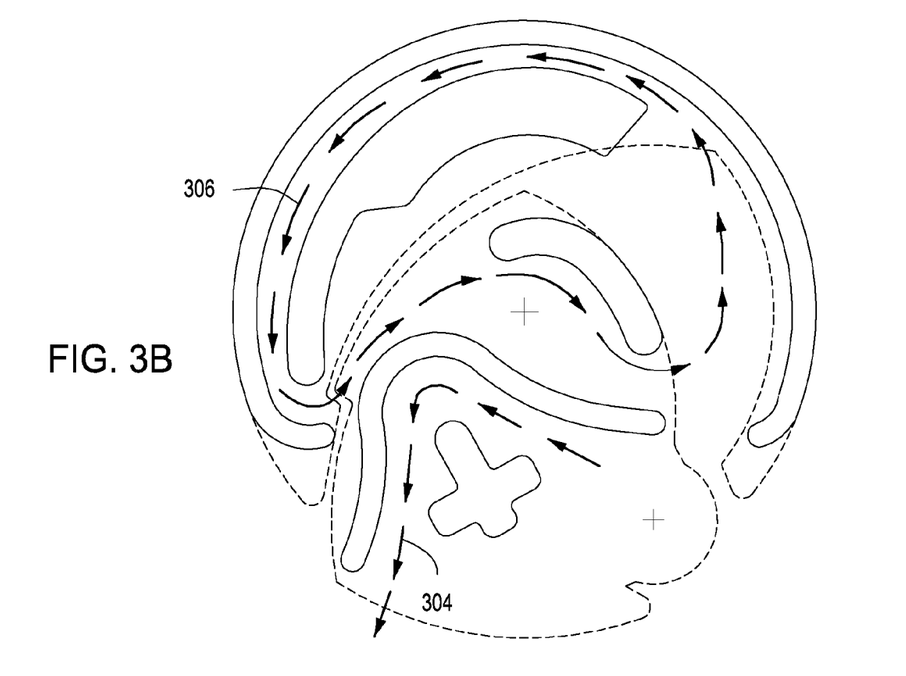

By providing the outer magnetic pole and inner magnetic pole in sections spanning across the first base plate 204 and a second base plate 206, rotation of the second base plate 206 with respect to the first base plate 204 will alter the relative position of the magnetic pole sections disposed on the second base plate 206 with respect to the magnetic pole sections disposed on the first base plate 204. The position of the magnetic pole sections on the second base plate 206 as well as the relative position of the second base plate 206 with respect to the first base plate 204 may be controlled such that a substantially closed loop magnetic field is provided in both the first position (as depicted in FIG. 2A) and the second position (as depicted in FIG. 2B) of the rotatable magnet assembly 148. For example, as depicted in FIG. 3B, when the rotatable magnet assembly 148 is in the second position, a second closed loop magnetic field 306 is provided (having a second geometric configuration) that is different than the first closed loop magnetic field 302 depicted in FIG. 3A.

In some embodiments, additional magnetic field tracks may be provided. For example, as depicted in FIG. 2A a supplemental magnetic pole 241 is provided adjacent to outer magnetic pole section 218 on a side opposite the inner magnetic pole section 220. The supplemental magnetic pole 241 includes a plurality of magnets 242 and a shunt plate 244. As depicted in FIG. 3A, the supplemental magnetic pole 241 and the outer magnetic pole section 218 together provide an open loop magnetic field 304.

In some embodiments, a position sensor 246 may be provided, for example, on one or more of the first base plate 204, the second base plate 206, or the support member 202 to monitor the position of the second base plate 206 with respect to the first base plate 204.

The closed track design of the present invention can advantageously sustain a large amount of DC power (e.g., 10's of kW's) at a low pressure (e.g., single digit mTorr). This is accomplished as the magnetic field lines are very efficient at confining electrons that orbit the field lines and are effectively trapped by the closed loop track design. In some embodiments of the present invention, the different positions of the magnetron may advantageously be used in different modes of operation, such as a first mode being a process mode, and a second mode being a clean mode. In some embodiments, the configuration of the magnetron does not provide full face erosion of the target, and some re-deposition of material occurs on the target.

For example, in one illustrative application, both DC and RF energy may be used to deposit a TiN film. TiN conventionally yields high particle generation by flaking or peeling from deposited surfaces or the sputtered target if there is re-deposition and the TiN is not "pasted" or glued by a titanium layer. If a number of cycles of TiN deposition is performed in the process mode, particle levels may begin to increase at the substrate level. However, the magnetron may be switched to the second mode, the clean mode, by moving a section of the magnet while retaining the closed track configuration. This advantageously moves the magnetic field lines to sputter the non-sputtered area of the target obtained in the process mode. In other words, the dual position magnetron allows tailoring of the maximum Br location. Thus, the target surface can advantageously be kept clean. By keeping the closed track design in both modes the target clean efficiency is very high as 10 s of kW of DC can be sustained at low sputter pressures (e.g., single digit mTorr). Alternatively, in some embodiments, the second magnetron configuration or mode could provide a second process mode.

Returning to FIG. 1, in some embodiments, the magnetron assembly 196 includes a motor 176, a motor shaft 174, a gear assembly 178, and the rotatable magnet assembly 148. The rotatable magnet assembly 148 includes a plurality of magnets 150 and is configured to rotate the plurality of magnets 150 about the central axis 186 as described below. The motor 176 may be an electric motor, a pneumatic or hydraulic drive, or any other process-compatible mechanism that can provide the required torque. While one illustrative embodiment is described herein to illustrate how the rotatable magnet assembly 148 may be rotated, other configurations may also be used.

In use, the magnetron assembly 196 rotates the rotatable magnet assembly 148 within the cavity 170. For example, in some embodiments, the motor 176, motor shaft 174, and gear assembly 178 may be provided to rotate the rotatable magnet assembly 148. In conventional PVD chambers having magnetrons, the magnetron drive shaft is typically disposed along the central axis of the chamber, preventing the coupling of RF energy in a position aligned with the central axis of the chamber. To the contrary, in embodiments of the present invention, the electrode 154 is aligned with the central axis 186 of the process chamber 104, and motor shaft 174 of the magnetron may be disposed through an off-center opening in the ground plate 156. The end of the motor shaft 174 protruding from the ground plate 156 is coupled to the motor 176. The motor shaft 174 is further disposed through an off-center opening in the source distribution plate 158 and coupled to a gear assembly 178.

The gear assembly 178 may be supported by any suitable means, such as by being coupled to a bottom surface of the source distribution plate 158. The gear assembly 178 may be insulated from the source distribution plate 158 by fabricating at least the upper surface of the gear assembly 178 from a dielectric material, or by interposing an insulator layer (not shown) between the gear assembly 178 and the source distribution plate 158, or the like, or by constructing the motor shaft 174 out of suitable dielectric material. The gear assembly 178 is further coupled to the rotatable magnet assembly 148 to transfer the rotational motion provided by the motor 176 to the rotatable magnet assembly 148. The gear assembly 178 may be coupled to the rotatable magnet assembly 148 through the use of pulleys, gears, or other suitable means of transferring the rotational motion provided by the motor 176.

The substrate support 106 has a material-receiving surface facing a principal surface of a target assembly 114 and supports the substrate 108 to be sputter coated in planar position opposite to the principal surface of the target assembly 114. The substrate support 106 may support the substrate 108 in a central region 120 of the process chamber 104. The central region 120 is defined as the region above the substrate support 106 during processing (for example, between the target assembly 114 and the substrate support 106 when in a processing position).

In some embodiments, the substrate support 106 may be vertically movable to allow the substrate 108 to be transferred onto the substrate support 106 through a load lock valve (not shown) in the lower portion of the process chamber 104 and thereafter raised to a deposition, or processing position. A bellows 122 connected to a bottom chamber wall 124 may be provided to maintain a separation of the inner volume of the process chamber 104 from the atmosphere outside of the process chamber 104 while facilitating vertical movement of the substrate support 106. One or more gases may be supplied from a gas source 126 through a mass flow controller 128 into the lower part of the process chamber 104. An exhaust port 130 may be provided and coupled to a pump (not shown) via a valve 132 for exhausting the interior of the process chamber 104 and to facilitate maintaining a desired pressure inside the process chamber 104.

An RF bias power source 134 may be coupled to the substrate support 106 in order to induce a negative DC bias on the substrate 108. In addition, in some embodiments, a negative DC self-bias may form on the substrate 108 during processing. For example, RF energy supplied by the RF bias power source 134 may range in frequency from about 2 MHz to about 60 MHz, for example, non-limiting frequencies such as 2 MHz, 13.56 MHz, or 60 MHz can be used. In some embodiments, RF power may be supplied in a range from about 2 kW to about 20 kW. In some embodiments, DC power may be supplied in range from about 2 kW to about 40 kW. In other applications, the substrate support 106 may be grounded or left electrically floating. Alternatively or in combination, a capacitance tuner 136 may be coupled to the substrate support 106 for adjusting voltage on the substrate 108 for applications where RF bias power may not be desired.

The process chamber 104 further includes a process kit shield, or shield, 138 to surround the processing volume, or central region, of the process chamber 104 and to protect other chamber components from damage and/or contamination from processing. In some embodiments, the shield 138 may be connected to a ledge 140 of an upper grounded enclosure wall 110 of the process chamber 104. As illustrated in FIG. 1, the chamber lid 102 may rest on the ledge 140 of the upper grounded enclosure wall 116. Similar to the lower grounded enclosure wall 110, the upper grounded enclosure wall 116 may provide a portion of the RF return path between the lower grounded enclosure wall 110 and the grounding assembly 103 of the chamber lid 102. However, other RF return paths are possible, such as via the grounded shield 138.

The shield 138 extends downwardly and may include a generally tubular portion having a generally constant diameter that generally surrounds the central region 120. The shield 138 extends along the walls of the upper grounded enclosure wall 116 and the lower grounded enclosure wall 110 downwardly to below a top surface of the substrate support 106 and returns upwardly until reaching a top surface of the substrate support 106 (e.g., forming a u-shaped portion at the bottom of the shield 138). A cover ring 146 rests on the top of an upwardly extending inner portion of the shield 138 when the substrate support 106 is in its lower, loading position but rests on the outer periphery of the substrate support 106 when it is in its upper, deposition position to protect the substrate support 106 from sputter deposition. An additional deposition ring (not shown) may be used to protect the edges of the substrate support 106 from deposition around the edge of the substrate 108.

In some embodiments, a magnet 152 may be disposed about the process chamber 104 for selectively providing a magnetic field between the substrate support 106 and the target assembly 114. For example, as shown in FIG. 1, the magnet 152 may be disposed about the outside of the enclosure wall 110 in a region just above the substrate support 106 when in processing position. In some embodiments, the magnet 152 may be disposed additionally or alternatively in other locations, such as adjacent the upper grounded enclosure wall 116. The magnet 152 may be an electromagnet and may be coupled to a power source (not shown) for controlling the magnitude of the magnetic field generated by the electromagnet.

The chamber lid 102 generally includes the grounding assembly 103 disposed about the target assembly 114. The grounding assembly 103 may include a grounding plate 156 having a first surface 157 that may be generally parallel to and opposite a backside of the target assembly 114. A grounding shield 112 may extend from the first surface 157 of the grounding plate 156 and surround the target assembly 114. The grounding assembly 103 may include a support member 175 to support the target assembly 114 within the grounding assembly 103.

In some embodiments, the support member 175 may be coupled to a lower end of the grounding shield 112 proximate an outer peripheral edge of the support member 175 and extends radially inward to support a seal ring 181, and the target assembly 114. The seal ring 181 may be a ring or other annular shape having a desired cross-section. The seal ring 181 may include two opposing planar and generally parallel surfaces to facilitate interfacing with the target assembly 114, such as the backing plate assembly 160, on a first side of the seal ring 181 and with the support member 175 on a second side of the seal ring 181. The seal ring 181 may be made of a dielectric material, such as ceramic. The seal ring 181 may insulate the target assembly 114 from the ground assembly 103.

The support member 175 may be a generally planar member having a central opening to accommodate the target assembly 114. In some embodiments, the support member 175 may be circular, or disc-like in shape, although the shape may vary depending upon the corresponding shape of the chamber lid and/or the shape of the substrate to be processed in the PVD processing system 100.

The target assembly 114 may comprise a source material 113 to be deposited on a substrate, such as the substrate 108 during sputtering, such as a metal, metal oxide, metal alloy, or the like. In embodiments consistent with the present invention, the target assembly 114 includes a backing plate assembly 160 to support the source material 113. The source material 113 may be disposed on a substrate support facing side of the backing plate assembly 160 as illustrated in FIG. 1. The backing plate assembly 160 may comprise a conductive material, such as copper-zinc, copper-chrome, or the same material as the target, such that RF and DC power can be coupled to the source material 113 via the backing plate assembly 160. Alternatively, the backing plate assembly 160 may be non-conductive and may include conductive elements (not shown) such as electrical feedthroughs or the like.

In some embodiments, the backing plate assembly 160 includes a first backing plate 161 and a second backing plate 162. The first backing plate 161 and the second backing plate 162 may be disc shaped, rectangular, square, or any other shape that may be accommodated by the PVD processing system 100. A front side of the first backing plate is configured to support the source material 113 such that a front surface of the source material opposes the substrate 108 when present. The source material 113 may be coupled to the first backing plate 161 in any suitable manner. For example, in some embodiments, the source material 113 may be diffusion bonded to the first backing plate 161.

A plurality of sets of channels 169 may be disposed between the first and second backing plates 161, 162. The first and second backing plates 161, 162 may be coupled together to form a substantially water tight seal (e.g., a fluid seal between the first and second backing plates) to prevent leakage of coolant provided to the plurality of sets of channels 169. In some embodiments, the target assembly 114 may further comprise a central support member 192 to support the target assembly 114 within the process chamber 104.

In some embodiments, the conductive support ring 164 may be disposed between the source distribution plate 158 and the backside of the target assembly 114 to propagate RF energy from the source distribution plate to the peripheral edge of the target assembly 114. The conductive support ring 164 may be cylindrical, with a first end 166 coupled to a target-facing surface of the source distribution plate 158 proximate the peripheral edge of the source distribution plate 158 and a second end 168 coupled to a source distribution plate-facing surface of the target assembly 114 proximate the peripheral edge of the target assembly 114. In some embodiments, the second end 168 is coupled to a source distribution plate facing surface of the backing plate assembly 160 proximate the peripheral edge of the backing plate assembly 160.

An insulative gap 180 is provided between the grounding plate 156 and the outer surfaces of the source distribution plate 158, the conductive support ring 164, and the target assembly 114 (and/or backing plate assembly 160). The insulative gap 180 may be filled with air or some other suitable dielectric material, such as a ceramic, a plastic, or the like. The distance between the grounding plate 156 and the source distribution plate 158 depends on the dielectric material between the grounding plate 156 and the source distribution plate 158. Where the dielectric material is predominantly air, the distance between the grounding plate 156 and the source distribution plate 158 may be between about 15 mm and about 40 mm.

The grounding assembly 103 and the target assembly 114 may be electrically separated by the seal ring 181 and by one or more of insulators (not shown) disposed between the first surface 157 of the grounding plate 156 and the backside of the target assembly 114, e.g., a non-target facing side of the source distribution plate 158.

The PVD processing system 100 has an RF power source 182 connected to an electrode 154 (e.g., a RF feed structure). The electrode 154 may pass through the grounding plate 156 and is coupled to the source distribution plate 158. The RF power source 182 may include an RF generator and a matching circuit, for example, to minimize RF energy reflected back to the RF generator during operation. For example, RF energy supplied by the RF power source 182 may range in frequency from about 13.56 MHz to about 162 MHz or above. For example, non-limiting frequencies such as 13.56 MHz, 27.12 MHz, 40.68 MHz, 60 MHz, or 162 MHz can be used.

In some embodiments, PVD processing system 100 may include a second energy source 183 to provide additional energy to the target assembly 114 during processing. In some embodiments, the second energy source 183 may be a DC power source to provide DC energy, for example, to enhance a sputtering rate of the target material (and hence, a deposition rate on the substrate). In some embodiments, the second energy source 183 may be a second RF power source, similar to the RF power source 182, to provide RF energy, for example, at a second frequency different than a first frequency of RF energy provided by the RF power source 182. In embodiments where the second energy source 183 is a DC power source, the second energy source may be coupled target assembly 114 in any location suitable to electrically couple the DC energy to the target assembly 114, such as the electrode 154 or some other conductive member (such as the source distribution plate 158, discussed below). In embodiments where the second energy source 183 is a second RF power source, the second energy source may be coupled to the target assembly 114 via the electrode 154.

The electrode 154 may be cylindrical or otherwise rod-like and may be aligned with a central axis 186 of the process chamber 104 (e.g., the electrode 154 may be coupled to the target assembly at a point coincident with a central axis of the target, which is coincident with the central axis 186). The electrode 154, aligned with the central axis 186 of the process chamber 104, facilitates applying RF energy from the RF power source 182 to the target assembly 114 in an axisymmetrical manner (e.g., the electrode 154 may couple RF energy to the target at a "single point" aligned with the central axis of the PVD chamber). The central position of the electrode 154 helps to eliminate or reduce deposition asymmetry in substrate deposition processes. The electrode 154 may have any suitable diameter. For example, although other diameters may be used, in some embodiments, the diameter of the electrode 154 may be about 0.5 to about 2 inches. The electrode 154 may generally have any suitable length depending upon the configuration of the PVD chamber. In some embodiments, the electrode may have a length of between about 0.5 to about 12 inches. The electrode 154 may be fabricated from any suitable conductive material, such as aluminum, copper, silver, or the like. Alternatively, in some embodiments, the electrode 154 may be tubular. In some embodiments, the diameter of the tubular electrode 154 may be suitable, for example, to facilitate providing a central shaft for the magnetron.

The electrode 154 may pass through the ground plate 156 and is coupled to the source distribution plate 158. The ground plate 156 may comprise any suitable conductive material, such as aluminum, copper, or the like. The open spaces between the one or more insulators (not shown) allow for RF wave propagation along the surface of the source distribution plate 158. In some embodiments, the one or more insulators may be symmetrically positioned with respect to the central axis 186 of the PVD processing system. Such positioning may facilitate symmetric RF wave propagation along the surface of the source distribution plate 158 and, ultimately, to a target assembly 114 coupled to the source distribution plate 158. The RF energy may be provided in a more symmetric and uniform manner as compared to conventional PVD chambers due, at least in part, to the central position of the electrode 154.

A controller 194 may be provided and coupled to various components of the PVD processing system 100 to control the operation thereof. The controller 194 includes a central processing unit (CPU) 118, a memory 172, and support circuits 173. The controller 194 may control the PVD processing system 100 directly, or via computers (or controllers) associated with particular process chamber and/or support system components. The controller 194 may be one of any form of general-purpose computer processor that can be used in an industrial setting for controlling various chambers and sub-processors. The memory, or computer readable medium, 172 of the controller 194 may be one or more of readily available memory such as random access memory (RAM), read only memory (ROM), floppy disk, hard disk, optical storage media (e.g., compact disc or digital video disc), flash drive, or any other form of digital storage, local or remote. The support circuits 173 are coupled to the CPU 118 for supporting the processor in a conventional manner. These circuits include cache, power supplies, clock circuits, input/output circuitry and subsystems, and the like. Inventive methods as described herein may be stored in the memory 172 as software routine that may be executed or invoked to control the operation of the PVD processing system 100 in the manner described herein. The software routine may also be stored and/or executed by a second CPU (not shown) that is remotely located from the hardware being controlled by the CPU 118.

While the foregoing is directed to embodiments of the present invention, other and further embodiments of the invention may be devised without departing from the basic scope thereof.

The invention claimed is:

1. A magnetron assembly, comprising:
a first base plate;
a second base plate having a limited range of motion with respect to the first base plate between a first position and a second position;
an outer magnetic pole in the shape of a loop and comprising an outer magnetic pole section coupled to the first base plate and an outer magnetic pole section coupled to the second base plate; and
an inner magnetic pole disposed within the outer magnetic pole, wherein the outer and inner magnetic poles define a closed loop magnetic field, and wherein the closed loop magnetic field is maintained when the second base plate is disposed in both the first position and the second position.

2. The magnetron assembly of claim 1, wherein the closed loop magnetic field has a first geometric configuration when the second base plate is disposed in the first position and a second geometric configuration, different than the first geometric configuration, when the second base plate is disposed in the second position.

3. The magnetron assembly of claim 1, further comprising:
a support member coupled to the first base plate and the second base plate, the support member having a central axis about which the magnetron assembly rotates.

4. The magnetron assembly of claim 3, wherein the first base plate is fixedly coupled to the support member and the second base plate is movably coupled to the support member.

5. The magnetron assembly of claim 1, wherein the inner magnetic pole comprises:
an inner magnetic pole section coupled to the first base plate and an inner magnetic pole section coupled to the second base plate.

6. The magnetron assembly of claim 1, wherein each of the inner and outer magnetic poles are formed by a plurality of magnets.

7. The magnetron assembly of claim 6, further comprising:
a plurality of pole plates, one each coupled to tops of the pluralities of magnets of each of the magnetic poles or magnetic pole sections to provide a more uniform magnetic field.

8. The magnetron assembly of claim 6, wherein each of the magnets in a respective inner or outer magnetic pole has the same polarity, and wherein a polarity of the outer magnetic pole is opposite the polarity of the inner magnetic pole.

9. The magnetron assembly of claim 6, wherein less than half of any plurality of magnets that form a given magnetic pole have a polarity opposite the polarity of remaining magnets of the plurality of magnets that form the given magnetic pole.

10. A magnetron assembly, comprising:
a first base plate;
a second base plate movable with respect to the first base plate between a first position and a second position;
an outer magnetic pole in the shape of a loop and comprising an outer magnetic pole section coupled to the first base plate and an outer magnetic pole section coupled to the second base plate; and
an inner magnetic pole disposed within the outer magnetic pole, wherein the outer and inner magnetic poles define a closed loop magnetic field, and wherein the closed loop magnetic field is maintained when the second base plate is disposed in both the first position and a second position, wherein each of the inner and outer magnetic poles are formed by a plurality of magnets, and wherein about 15% to about 25% of individual magnets of any plurality of magnets that form a given magnetic pole have a polarity opposite the polarity of remaining magnets of the plurality of magnets that form the given magnetic pole.

11. The magnetron assembly of claim 1, wherein each of the outer magnetic pole sections have a first polarity, and wherein the inner magnetic pole has a second polarity opposite of the first polarity.

12. The magnetron assembly of claim 1, further comprising:
a supplemental magnetic pole disposed adjacent to the outer magnetic pole on a side opposite the inner magnetic pole.

13. The magnetron assembly of claim 12, wherein the supplemental magnetic pole and the outer magnetic pole section together provide an open loop magnetic field.

14. The magnetron assembly of claim 1, further comprising:
a position sensor to monitor the position of the second base plate with respect to the first base plate.

15. A magnetron assembly, comprising:
a support member having a central axis about which the magnetron assembly rotates;
a first base plate fixedly coupled to the support member;
a second base plate movably coupled to the support member with a limited range of motion between a first position and a second position;
an outer magnetic pole in the shape of a loop and comprising an outer magnetic pole section coupled to the first base plate and an outer magnetic pole section coupled to the second base plate; and
an inner magnetic pole disposed within the outer magnetic pole, wherein the outer and inner magnetic poles define a closed loop magnetic field, and wherein the closed loop magnetic field is maintained when the second base plate is disposed in both the first position and a second position, wherein the closed loop magnetic field has a first geometric configuration when the second base plate is disposed in the first position and a second geometric configuration, different than the first geometric configuration, when the second base plate is disposed in the second position.

16. The magnetron assembly of claim 15, further comprising:
a bracket rotatably coupling the second base plate to the support member between the first position and the second position.

17. A substrate processing system, comprising:
a chamber;
a lid removably disposed atop the chamber;
a target assembly coupled to the lid, the target assembly including a target material to be sputtered from the target assembly and deposited on a substrate;
a substrate support disposed within the chamber for supporting a substrate during processing; and
the magnetron assembly of claim 1 disposed proximate the target assembly.

18. The substrate processing system of claim 17, further comprising:
a DC power source coupled to the target assembly; and
an RF power source coupled to the target assembly.

19. The substrate processing system of claim 17, further comprising:
an RF bias power source coupled to the substrate support.

20. The substrate processing system of claim 17, wherein the target material comprises titanium.

* * * * *